(12) United States Patent  
Spindler et al.

(10) Patent No.: US 8,877,350 B2  
(45) Date of Patent: Nov. 4, 2014

(54) WHITE OLED WITH TWO BLUE LIGHT-EMITTING LAYERS

(75) Inventors: Jeffrey P. Spindler, Rochester, NY (US); Tukaram K. Hatwar, Penfield, NY (US)

(73) Assignee: Global OLED Technology LLC, Herndon, VA (US)

( * ) Notice: Subject to any disclaimer, the term of this patent is extended or adjusted under 35 U.S.C. 154(b) by 1723 days.

(21) Appl. No.: 11/954,083

(22) Filed: Dec. 11, 2007

(65) Prior Publication Data

US 2009/0146552 A1 Jun. 11, 2009

(51) Int. Cl.
*H01L 51/54* (2006.01)
*H01L 51/50* (2006.01)
*H01L 51/52* (2006.01)

(52) U.S. Cl.
CPC ........ *H01L 51/5036* (2013.01); *H01L 51/5278* (2013.01); *Y10S 428/917* (2013.01)
USPC ........... 428/690; 428/917; 313/504; 313/505; 313/506; 257/40; 257/E51.05; 257/E51.026; 257/E51.032

(58) Field of Classification Search
USPC ............ 428/690, 917; 313/504, 505, 506; 257/40, E51.05, E51.026, E51.032
See application file for complete search history.

(56) References Cited

U.S. PATENT DOCUMENTS

| | | |
|---|---|---|
| 3,180,730 A | 4/1965 | Klupfel et al. |
| 3,567,450 A | 3/1971 | Brantly et al. |
| 3,658,520 A | 4/1972 | Brantly et al. |
| 4,356,429 A | 10/1982 | Tang |
| 4,539,507 A | 9/1985 | Vanslyke et al. |
| 4,720,432 A | 1/1988 | VanSlyke et al. |
| 4,769,292 A | 9/1988 | Tang et al. |
| 4,885,211 A | 12/1989 | Tang et al. |
| 5,061,569 A | 10/1991 | VanSlyke et al. |
| 5,121,029 A | 6/1992 | Hosokawa et al. |
| 5,141,671 A | 8/1992 | Bryan et al. |
| 5,150,006 A | 9/1992 | VanSlyke et al. |
| 5,151,629 A | 9/1992 | VanSlyke |
| 5,276,380 A | 1/1994 | Tang |
| 5,294,870 A | 3/1994 | Tang et al. |
| 5,405,709 A | 4/1995 | Littman et al. |

(Continued)

FOREIGN PATENT DOCUMENTS

| | | |
|---|---|---|
| CN | 1918261 | 2/2007 |
| CN | 101005119 | 7/2007 |

(Continued)

OTHER PUBLICATIONS

Kido et al, White light-emitting electroluminescent organic devices using the poly(N-vinylcarbazole) emitter layer doped with three fluorescent dyes, Applied Physics Letters 64, 815 (1994).

(Continued)

*Primary Examiner* — Gregory Clark
(74) *Attorney, Agent, or Firm* — Global OLED Technology LLC

(57) ABSTRACT

An organic white light-emitting device, including a substrate; an anode and a cathode spaced from each other; a light-emitting layer including a yellow dopant for emitting yellow light; and first and second blue light-emitting layers, each blue light-emitting layer having at least one different material than the other blue light-emitting layer.

8 Claims, 3 Drawing Sheets

(56) References Cited

U.S. PATENT DOCUMENTS

| | | | |
|---|---|---|---|
| 5,484,922 A | 1/1996 | Moore et al. | |
| 5,593,788 A | 1/1997 | Shi et al. | |
| 5,645,948 A | 7/1997 | Shi et al. | |
| 5,683,823 A | 11/1997 | Shi et al. | |
| 5,755,999 A | 5/1998 | Shi et al. | |
| 5,776,623 A | 7/1998 | Hung et al. | |
| 5,928,802 A | 7/1999 | Shi et al. | |
| 5,935,720 A | 8/1999 | Chen et al. | |
| 5,935,721 A | 8/1999 | Shi et al. | |
| 6,020,078 A | 2/2000 | Chen et al. | |
| 6,107,734 A | 8/2000 | Tanaka et al. | |
| 6,208,075 B1 | 3/2001 | Hung et al. | |
| 6,337,492 B1 | 1/2002 | Jones et al. | |
| 6,565,996 B2 | 5/2003 | Hatwar et al. | |
| 6,692,846 B2 | 2/2004 | Hatwar et al. | |
| 6,717,358 B1 | 4/2004 | Liao et al. | |
| 6,818,327 B2 | 11/2004 | Tagami et al. | |
| 6,967,062 B2 | 11/2005 | Hatwar et al. | |
| 7,252,893 B2 | 8/2007 | Ricks et al. | |
| 7,255,938 B2 | 8/2007 | Hamada et al. | |
| 2003/0170491 A1 | 9/2003 | Liao et al. | |
| 2003/0189401 A1 | 10/2003 | Kido et al. | |
| 2005/0093433 A1 | 5/2005 | Ko | |
| 2005/0095454 A1 | 5/2005 | Ko et al. | |
| 2005/0181232 A1 | 8/2005 | Ricks et al. | |
| 2005/0249972 A1 | 11/2005 | Hatwar et al. | |
| 2006/0003184 A1* | 1/2006 | Hatwar et al. | 428/690 |
| 2006/0040132 A1 | 2/2006 | Liao et al. | |
| 2007/0001588 A1 | 1/2007 | Boroson et al. | |
| 2007/0063638 A1 | 3/2007 | Tokairin et al. | |
| 2007/0090753 A1 | 4/2007 | Arakane | |
| 2007/0134515 A1 | 6/2007 | Fukuoka et al. | |
| 2007/0164278 A1* | 7/2007 | Lee et al. | 257/40 |
| 2007/0228938 A1 | 10/2007 | Hatwar et al. | |
| 2007/0252515 A1 | 11/2007 | Cosimbescu et al. | |

FOREIGN PATENT DOCUMENTS

| | | |
|---|---|---|
| CN | 101006594 | 7/2007 |
| CN | 101394696 | 3/2009 |
| EP | 0 732 868 | 9/1996 |
| EP | 0 891 121 | 1/1999 |
| EP | 1 029 909 | 8/2000 |
| EP | 1 651 012 A1 | 4/2006 |
| EP | 1 811 586 A1 | 7/2007 |
| JP | 07-142169 | 6/1995 |
| JP | 2003-045676 | 2/2003 |
| WO | WO 98/55561 | 12/1998 |
| WO | WO 00/18851 | 4/2000 |
| WO | WO 00/57676 | 9/2000 |
| WO | WO 00/70655 | 11/2000 |

OTHER PUBLICATIONS

Deshpande et al, White-light-emitting organic electroluminescent devices based on interlayer sequential energy transfer, Applied Physics Letters, 75 888 (1999).

Tokito et al, High-efficiency white phosphorescent organic light-emitting devices with greenish blue and red-emitting layers, Applied Physics Letters 83, 2459 (2003).

* cited by examiner

WHITE OLED WITH TWO BLUE LIGHT-EMITTING LAYERS

CROSS REFERENCE TO RELATED APPLICATIONS

Reference is made to commonly assigned U.S. patent application Ser. No. 11/393,767 filed Mar. 30, 2006 (now U.S. Patent Application Publication No. 2007/0228938), entitled "Efficient White Light OLED Display With Filters" by T. K. Hatwar et al and U.S. patent application Ser. No. 11/746,290 filed May 9, 2007, entitled "High Performance Tandem White OLED" by Jeffrey Spindler et al, the disclosures of which are incorporated herein by reference.

FIELD OF THE INVENTION

The present invention relates to white or broadband light-producing OLED displays with two blue light-emitting layers.

BACKGROUND OF THE INVENTION

An organic light-emitting diode device, also called an OLED, commonly includes an anode, a cathode, and an organic electroluminescent (EL) unit sandwiched between the anode and the cathode. The organic EL unit includes at least a hole-transporting layer (HTL), a light-emitting layer (LEL), and an electron-transporting layer (ETL). OLEDs are attractive because of their low drive voltage, high luminance, wide viewing-angle, and capability for full color displays and for other applications. Tang et al. described this multilayer OLED in their U.S. Pat. Nos. 4,769,292 and 4,885,211.

OLEDs can emit different colors, such as red, green, blue, or white, depending on the emitting property of its LEL. Recently, there is an increasing demand for broadband OLEDs to be incorporated into various applications, such as a solid-state lighting source, color display, or a full color display. By broadband emission, it is meant that an OLED emits sufficiently broad light throughout the visible spectrum so that such light can be used in conjunction with filters or color change modules to produce displays with at least two different colors or a full color display. In particular, there is a need for broadband-light-emitting OLEDs (or broadband OLEDs) where there is substantial emission in the red, green, and blue portions of the spectrum, i.e., a white light-emitting OLED (white OLED). The use of white OLEDs with color filters provides a simpler manufacturing process than an OLED having separately patterned red, green, and blue emitters. This can result in higher throughput, increased yield, and cost savings. White OLEDs have been reported, e.g. by Kido et al. in *Applied Physics Letters*, 64, 815 (1994), J. Shi et al. in U.S. Pat. No. 5,683,823, Sato et al. in JP 07-142169, Deshpande et al. in *Applied Physics Letters*, 75, 888 (1999), and Tokito, et al. in *Applied Physics Letters*, 83, 2459 (2003).

In order to achieve broadband emission from an OLED, more than one type of molecule has to be excited, because each type of molecule only emits light with a relatively narrow spectrum under normal conditions. A light-emitting layer having a host material and one or more luminescent dopant(s) can achieve light emission from both the host and the dopant(s) resulting in a broadband emission in the visible spectrum if the energy transfer from the host material to the dopant(s) is incomplete. To achieve a white OLED having a single light-emitting layer, the concentrations of light-emitting dopants must be carefully controlled. This produces manufacturing difficulties. A white OLED having two or more light-emitting layers can have better color and better luminance efficiency than a device with one light-emitting layer, and the variability tolerance for dopant concentration is higher. It has also been found that white OLEDs having two light-emitting layers are typically more stable than OLEDs having a single light-emitting layer. However, it is difficult to achieve light emission with strong intensity in the red, green, and blue portions of the spectrum. A white OLED with two light-emitting layers typically has two intensive emission peaks.

A tandem OLED structure (sometimes called a stacked OLED or a cascaded OLED) has been disclosed by Jones et al. in U.S. Pat. No. 6,337,492, Tanaka et al. in U.S. Pat. No. 6,107,734, Kido et al. in JP Patent Publication 2003/045676A and U.S. Patent Application Publication 2003/0189401 A1, and Liao et al. in U.S. Pat. No. 6,717,358 and U.S. Patent Application Publication 2003/0170491 A1. This tandem OLED is fabricated by stacking several individual OLED units vertically and driving the stack using a single power source. The advantage is that luminance efficiency, lifetime, or both are increased. However, the tandem structure increases the driving voltage approximately in proportion to the number of OLED units stacked together.

In OLED devices, there is a further need for improved stability. Commonly assigned U.S. Pat. No. 6,692,846 B2, U.S. Pat. No. 6,967,062 and U.S. Pat. No. 6,565,996 B2 all show effective ways for improving device lifetime. These patents disclose blue-light emitting layers with a hole-transporting host such as NPB, an anthracene cohost and a fluorescent blue dopant. However, these references do not address the problem of color shifts upon aging.

Commonly assigned U.S. Pat. No. 7,252,893B2 discloses white OLEDs with a yellow light-emitting layer and a blue light-emitting layer which contains NPB, an anthracene cohost and a fluorescent blue dopant. However, this reference does not address the problem of color shifts upon aging. U.S. Patent Application Publications 2007/0090753, 2007/0134515 and 2007/063638 also disclose white OLEDs with a yellow light-emitting layer and a blue light-emitting layer.

U.S. Pat. No. 7,255,938B2 discloses blue OLEDs with two blue light-emitting layers which contain NPB, an anthracene cohost and a fluorescent blue dopant. However, this reference does not address the problem of color shifts upon aging in white OLEDs.

Notwithstanding these developments, there remains a need to improve color stability upon aging as well as efficiency and luminance stability of white OLED devices.

SUMMARY OF THE INVENTION

It is therefore an object of the present invention to provide a white OLED device with improved color stability upon aging.

This object is achieved by an organic white light-emitting device, comprising:
(a) a substrate;
(b) an anode and a cathode spaced from each other;
(c) a light-emitting layer including a yellow dopant for emitting yellow light; and
(d) first and second blue light-emitting layers, each blue light-emitting layer having at least one different material than the other blue light-emitting layer.

In one embodiment of the invention, the white OLED device is a tandem OLED device with two or more light-emitting units disposed between the anode and cathode and an intermediate connector disposed between the two or more light-emitting units.

It is an advantage of this invention that it provides improved color stability for an OLED display, which is suitable for broadband applications. It is a further advantage of this invention that it provides improved drive voltage of the display. It is a further advantage of this invention that it can provide these improvements with good lifetime, low power consumption, and good color tunability.

Figure 1:
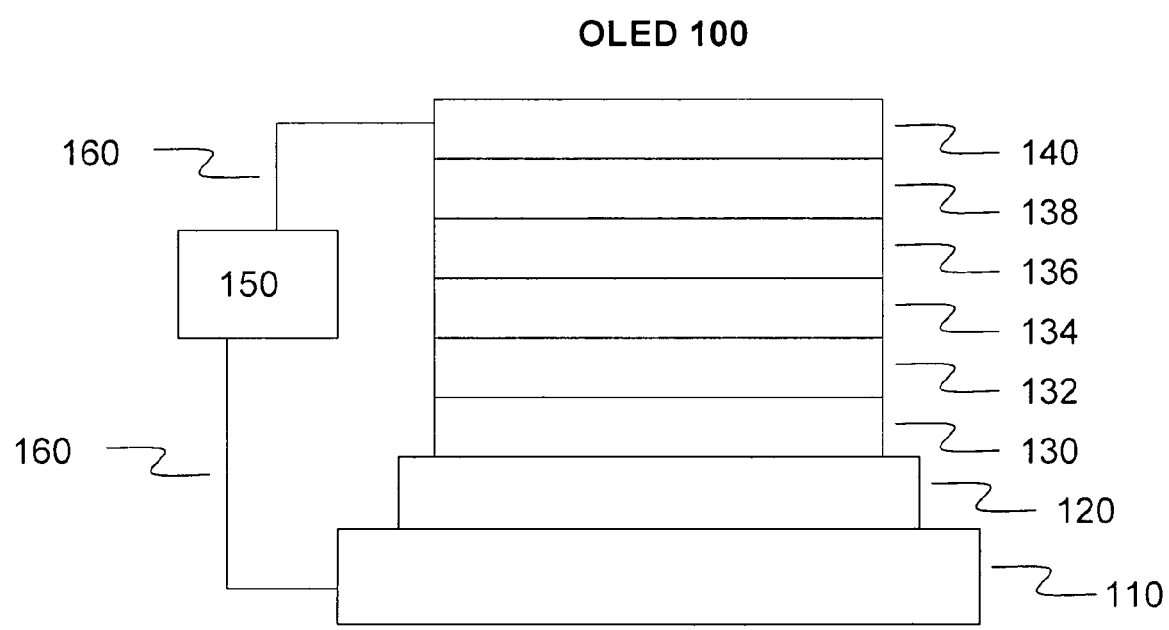
FIG. 1 shows a cross-sectional view of a white OLED device with one yellow and one blue light-emitting layer.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" is used in its art-recognized meaning of a display device comprising organic light-emitting diodes as pixels. It can mean a device having a single pixel. The term "OLED display" as used herein means an OLED device comprising a plurality of pixels, which can be of different colors. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be generated by appropriate mixing. The term "hue" refers to the intensity profile of light emission within the visible spectrum, with different hues exhibiting visually discernible differences in color. The term "pixel" is employed in its art-recognized usage to designate an area of a display panel that is stimulated to emit light independently of other areas. It is recognized that in full color systems, several pixels of different colors will be used together to produce a wide range of colors, and a viewer can term such a group a single pixel. For the purposes of this discussion, such a group will be considered several different colored pixels.

In accordance with this disclosure, broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a practical full color display. For low power consumption, it is often advantageous for the chromaticity of the white light-emitting OLED to be close to CIE $D_{65}$, i.e., CIEx=0.31 and CIEy=0.33. This is particularly the case for so-called RGBW displays having red, green, blue, and white pixels. Although CIEx, CIEy coordinates of about 0.31, 0.33 are ideal in some circumstances; the actual coordinates can vary significantly and still be very useful. The term "white light-emitting" as used herein refers to a device that produces white light internally, even though part of such light can be removed by color filters before viewing.

In this invention, white light is emitting by the minimum combination of a yellow light-emitting layer and two blue light-emitting layers. A yellow light-emitting layer produces light that has a single or multiple peaks at wavelengths longer than 550 nm, e.g. in the yellow, orange and red regions of the visible spectrum with the largest emission peaks in the yellow region, which is about 560-590 nm. The yellow light-emitting layer produces substantially no blue emission, meaning that the emission intensity at wavelengths shorter than 480 nm is less than 10% of the maximum emission intensity, and no more than 50% at 490 nm. The yellow light-emitting layer contains a yellow light-producing compound which refers to a substance that has its primary light emission in the yellow from about 560 nm to 590 nm, although it may have smaller amount of emission at wavelengths greater than about 590 nm. Each of the blue light-emitting layer produces light with the largest emission intensity from a single or multiple peaks at wavelengths less than about 500 nm. Each blue light-emitting layer produces substantially no green, yellow or red emission, meaning that the emission intensity at wavelengths greater than 540 nm is less than 20% of the maximum emission intensity, and no more than 10% at 600 nm. Each blue light-emitting layer contains a blue light-producing compound which refers to a substance that has its primary light emission in the blue region, that is, from about 420 nm to 500 nm or more typically, 450-490 nm.

The two blue light-emitting layers must contain at least one material different from the other. Desirably, the two blue light-emitting layers are in direct contact with each other and that one of the blue light-emitting layers is in direct contact with a yellow light-emitting layer. Suitably, each of the two blue light-emitting layers contains at least one non-emitting host and at least one blue light-emitting compound. The two blue light-emitting layers can have the same host or co-hosts with different blue light-emitting compounds, which is preferred, or the same blue light-emitting compound with different hosts or co-hosts. Using two different blue light-emitting compounds in each of the two blue layers is desirable since the blue emission of each layer will be different. This helps to broaden the overall blue emission of the device and improve efficiency and color.

Particularly suitable hosts for the blue layers are anthracene derivatives. The same anthracene derivative may be used in both blue layers or they may be different. Particularly suitable co-hosts for the blue layers are those that have hole transporting properties such as aromatic triarylamines. The ratio of host to cohost should be 50:50 or more, or most desirably in the range of 95:5 to 75:25. Particularly useful blue light-emitting compounds are bis(azinyl)azene boron complex compounds and styrylarenes including distyrylarenes. Suitable ranges for the blue light-emitting materials in the blue light-emitting layer is 0.5 to 10% by volume. One particularly desirable combination for a first or second blue light-emitting layer is an anthracene host and a bis(azinyl) azene boron complex compound as the blue light-emitter. Another particularly desirable combination for a first or second blue light-emitting layer is an anthracene host and a styrylamine as the blue light-emitter. One desirable embodiment of this invention has a first blue light-emitting layer, which is in direct contact with a yellow light-emitting layer, which contains an anthracene host, an aromatic amine co-host and a bis(azinyl)azene boron complex compound as the blue light-emitter and where the second blue light-emitting layer, which is located over the first blue light-emitting layer, contains an anthracene host and a styrylamine as the blue light-emitter. By "over", it is meant that the second blue light-emitting layer is located on the side of the first blue-light-emitting layer opposite from the yellow light-emitting layer.

FIG. 1 shows a cross-sectional view of a pixel of a white-light-emitting OLED device 100. OLED device 100 includes a substrate 110, two spaced electrodes, which are anode 120 and cathode 140, a yellow light-emitting layer 134 and a blue light-emitting layer 136 disposed between the electrodes, along with an HIL 130, a HTL 132 and an ETL 138 as well as a power source 150 and electrical connectors 160 that supply voltage to the anode 120 and cathode 140. The light-emitting layers 134 and 136 each produce different emission spectra.

Figure 2:
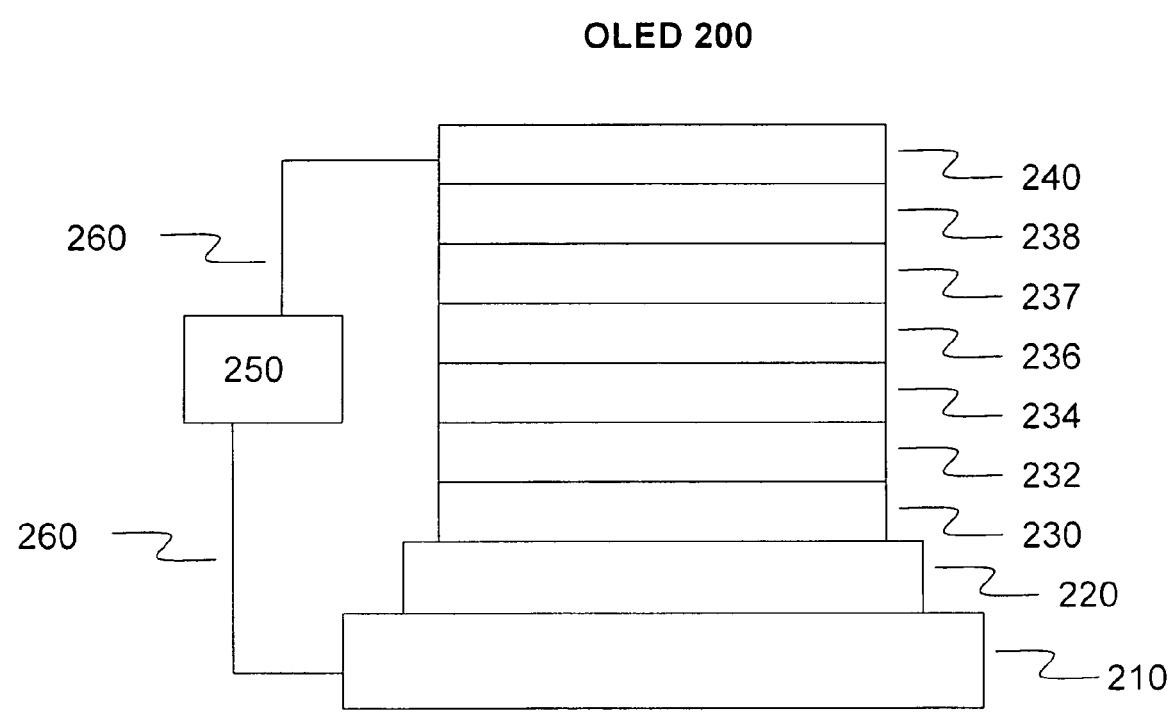
FIG. 2 shows a cross-sectional view of a white OLED with one yellow and two blue light-emitting layers in accordance with this invention.

FIG. 2 shows a cross-sectional view of a white OLED device 200 in accordance with this invention. It is like OLED 100 but contains a second blue-light emitting layer 237 located between the first blue light-emitting layer 236 and the ETL 238. The second blue light-emitting layer 237 contains at least one different material than the first blue light emitting layer 236. It is preferred that the blue-light producing compound in 236 is different than the blue light-emitting compound in 237. It is also desirable that the blue light-emitting layers 236 and 237 have different emissive spectrums. In addition, OLED device 200 contains an HIL 230 and a HTL 232 in addition to the power source 250 and electrocal connectors 260. As shown in FIG. 2, it is desirable for the first blue light-emitting layer 236 to be in direct contact with the yellow light-emitting layer 234 and that the second blue light-emitting layer 237 be in direct contact with the first blue-light-emitting layer 236.

Figure 3:
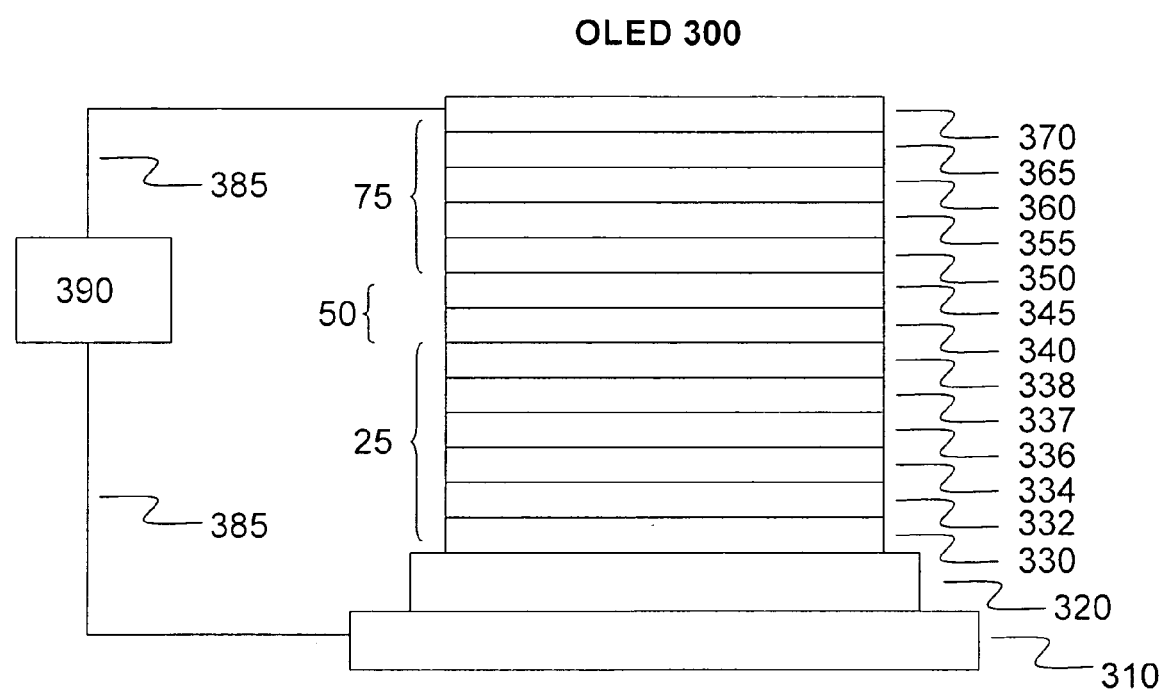
FIG. 3 shows a cross-sectional view of a white tandem with two electroluminescent units joined together with an intermediate connector. One of the electroluminescent units has one yellow and two blue light-emitting layers in accordance with this invention.

FIG. 3 shows a tandem OLED device 300 which is one embodiment of this invention. In this embodiment, there is a first light-emitting unit 25, an intermediate connector 50 and a second light-emitting unit 75. The first light-emitting unit 25 contains a yellow light-emitting layer 334 in direct contact with a first blue light-emitting layer 336 which is in direct contact with a second blue light-emitting layer 337. The first light-emitting unit 25 also contains a HIL 330, a HTL 332 and an ETL 338. The second light-emitting unit 75 also contains an ETL 365. OLED device 300 also contains a substrate 310, an anode 320, a cathode 370 along with a power source 390 and electrical connectors 385. The intermediate connector 50 is composed of two layers: HIL 340 and HTL 345. Other types of intermediate connectors may be used in the tandem devices of the invention.

Light-emitting layers such as those described herein produce light in response to hole-electron recombination. Any suitable process such as evaporation, sputtering, chemical vapor deposition, electrochemical process, or radiation thermal transfer from a donor material can deposit desired organic light-emitting materials. Useful organic light-emitting materials are well known. As more fully described in U.S. Pat. Nos. 4,769,292 and 5,935,721, the light-emitting layers of the OLED device comprise a luminescent or fluorescent material where electroluminescence is produced as a result of electron-hole pair recombination in this region. The light-emitting layers can be comprised of a single material, but more commonly include a host material doped with a guest compound or dopant where light emission comes primarily from the dopant. The dopant is selected to produce color light having a particular spectrum. The host materials in the light-emitting layers can be an electron-transporting material, a hole-transporting material, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula A) constitute one class of useful electron-transporting host materials capable of supporting electroluminescence, and are particularly suitable for light emission of wavelengths longer than 500 nm, e.g., green, yellow, orange, and red.

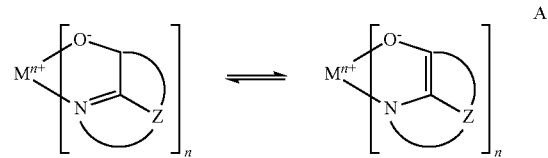

A wherein:
M represents a monovalent, divalent, or trivalent metal;
n is an integer of from 1 to 3; and
Z independently in each occurrence represents the atoms completing a nucleus having at least two fused aromatic rings.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2,2',2"-(1,3,5-phenylene)tris[1-phenyl-1H-benzimidazole].

The host material in one or more of the light-emitting layers of the present invention can include an anthracene derivative having hydrocarbon or substituted hydrocarbon substituents at the 9 and 10 positions. For example, certain derivatives of 9,10-diarylanthracenes (Formula B) are known to constitute a class of useful host materials capable of supporting electroluminescence, and are particularly suitable for light emission of wavelengths longer than 400 nm, e.g., blue, green, yellow, orange or red

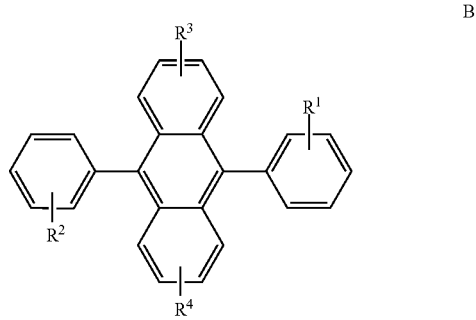

B wherein $R^1$, $R^2$, $R^3$, and $R^4$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Particularly useful are compounds wherein $R^1$ and $R^2$ represent additional aromatic rings. Specific examples of useful anthracene materials for use as a host in a light-emitting layer include:

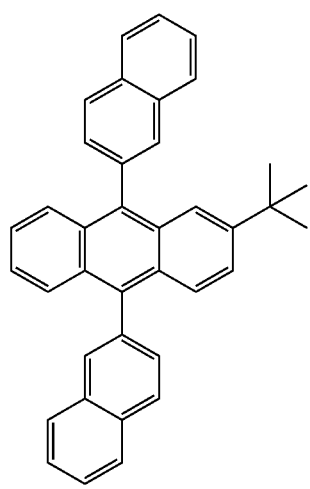

B1

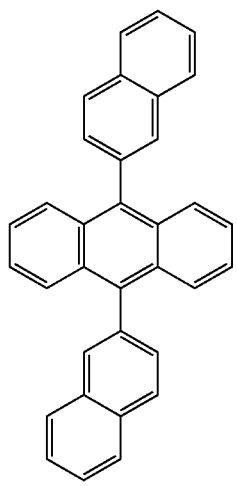

B2

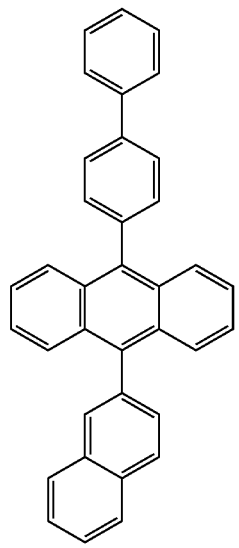

B3

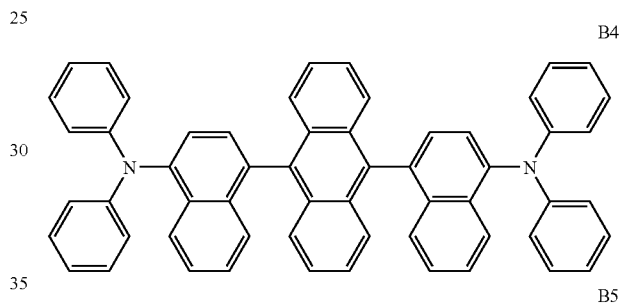

B4

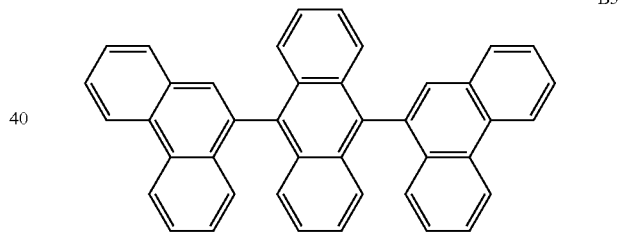

B5

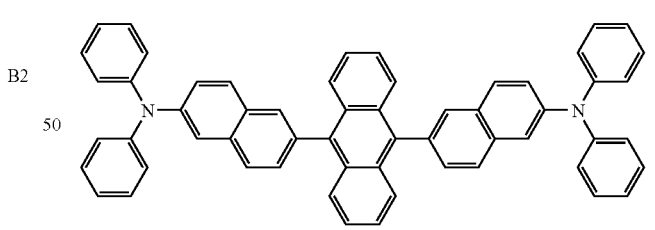

B6

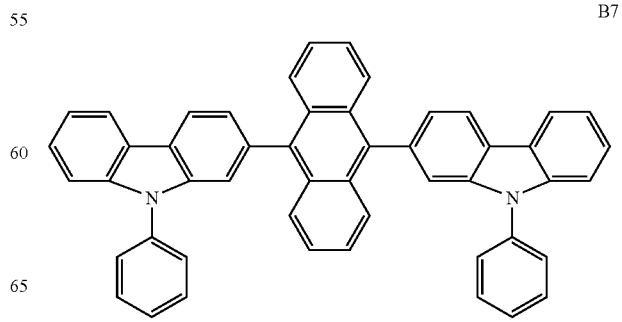

B7

-continued

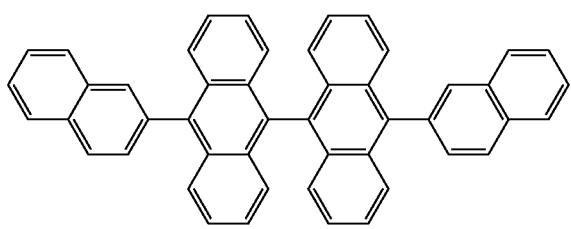
B8

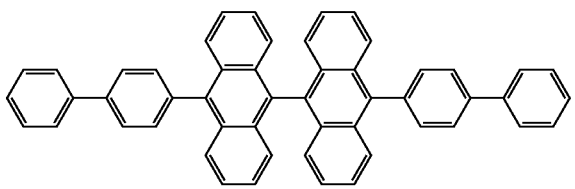
B9

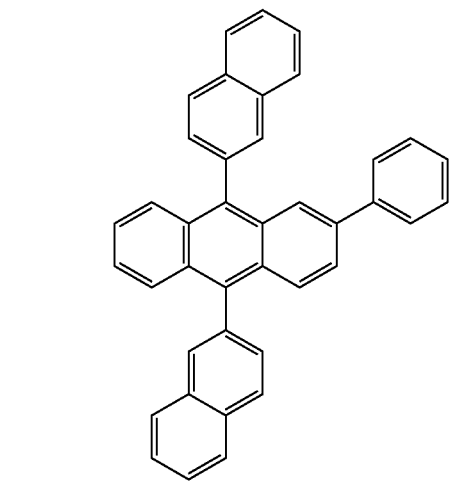
B10

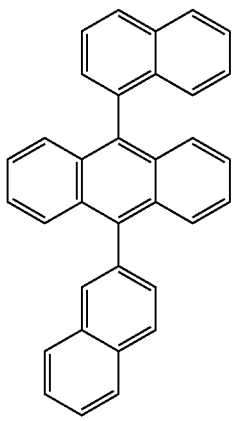
B11

Hole-transporting materials useful as hosts or co-hosts in light-emitting layers are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Klupfel et al. in U.S. Pat. No. 3,180,730 illustrate exemplary monomeric triarylamines. Other suitable triarylamines substituted with one or Brantley et al. in U.S. Pat. Nos. 3,567,450 and 3,658,520 disclose vinyl radicals or comprising at least one active hydrogen-containing group.

A more preferred class of aromatic tertiary amines are those which include at least two aromatic tertiary amine moieties as described in U.S. Pat. Nos. 4,720,432 and 5,061,569. Such compounds include those represented by structural Formula C.

C wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of Q1 or Q2 contains a polycyclic fused ring structure, e.g., a naphthalene. When G is an aryl group, it is conveniently a phenylene, biphenylene, or naphthalene moiety.

A useful class of triarylamines satisfying structural Formula C and containing two triarylamine moieties is represented by structural Formula D.

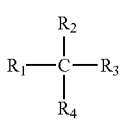
D where:

$R_1$ and $R_2$ each independently represent a hydrogen atom, an aryl group, or an alkyl group or $R_1$ and $R_2$ together represent the atoms completing a cycloalkyl group; and $R_3$ and $R_4$ each independently represent an aryl group, which is in turn substituted with a diaryl substituted amino group, as indicated by structural Formula E.

E wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula E, and linked through an arylene group. Useful tetraaryldiamines include those represented by Formula F.

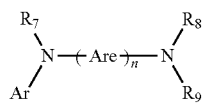

F wherein:
each Are is an independently selected arylene group, such as a phenylene or anthracene moiety;
n is an integer of from 1 to 4; and
Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae C, D, E, and F can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

In addition to a host material as described above, green light-emitting layer 360 also includes a 2,6-diaminoanthracene light-emitting dopant, as represented by the formula below:

G

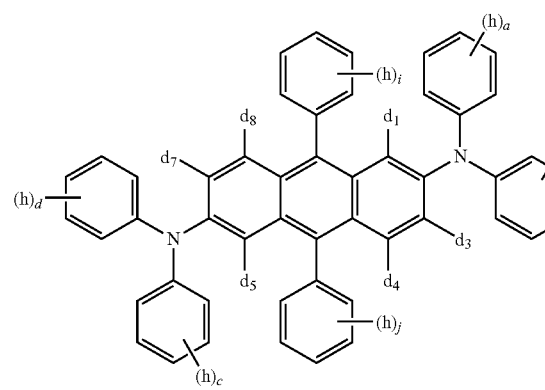

wherein $d_1$, $d_3$-$d_5$, and $d_7$-$d_8$ can be the same or different and each represents hydrogen or an independently selected substituent and each h can be the same or different and each represents one or more independently selected substituents, provided that two substituents can combine to form a ring group and a-d, i, and j are independently 0-5. Such diaminoanthracenes have been described by Klubek et al. in commonly-assigned U.S. patent application Ser. No. 11/668,515, the contents of which are incorporated by reference. The host material in green light-emitting layer 360 is desirably an anthracene host as described above.

Green light-emitting layer 360 can optionally include a small amount of a blue light-emitting compound as a stabilizer. The presence of a blue light-emitting compound, which is a higher-energy dopant, provides greater luminance stability to the green emission of 2,6-diaminoanthracene dopants, while maintaining good efficiency of the green light-emitting dopants. Blue light-emitting compounds can be those described below for blue light-emitting layers of the invention.

A red-light-emitting compound such as used in red light-emitting layer 350 can include a diindenoperylene compound of the following structure H:

H

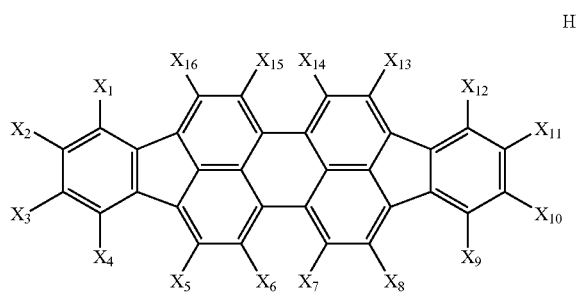

wherein:
$X_1$-$X_{16}$ are independently selected as hydrogen or substituents that include alkyl groups of from 1 to 24 carbon atoms; aryl or substituted aryl groups of from 5 to 20 carbon atoms; hydrocarbon groups containing 4 to 24 carbon atoms that complete one or more fused aromatic rings or ring systems; or halogen, provided that the substituents are selected to provide an emission maximum between 560 nm and 640 nm.

Illustrative examples of useful red dopants of this class are shown by Hatwar et al. in U.S. Patent Application Publication No. 2005/0249972, the contents of which are incorporated by reference.

Other red dopants useful in the present invention belong to the DCM class of dyes represented by Formula I:

(Formula I)

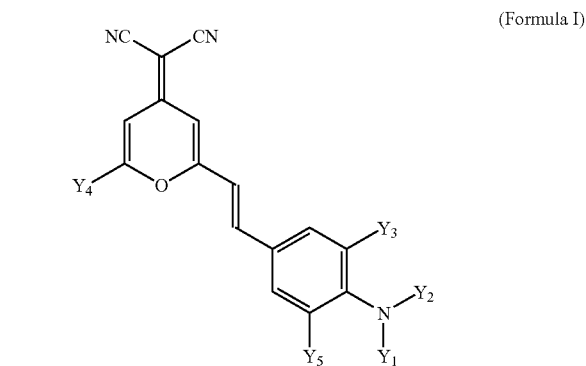

wherein $Y_1$-$Y_5$ represent one or more groups independently selected from: hydro, alkyl, substituted alkyl, aryl, or substituted aryl; $Y_1$-$Y_5$ independently include acyclic groups or can be joined pairwise to form one or more fused rings; provided that $Y_3$ and $Y_5$ do not together form a fused ring.

In a useful and convenient embodiment that provides red luminescence, $Y_1$-$Y_5$ are selected independently from: hydro, alkyl and aryl. In U.S. Patent Application Publication 2005/0181232, structures of particularly useful dopants of the DCM class, are shown, the contents of which are incorporated by reference.

A light-emitting yellow compound such as used in yellow light-emitting layer can include a compound of the following structures:

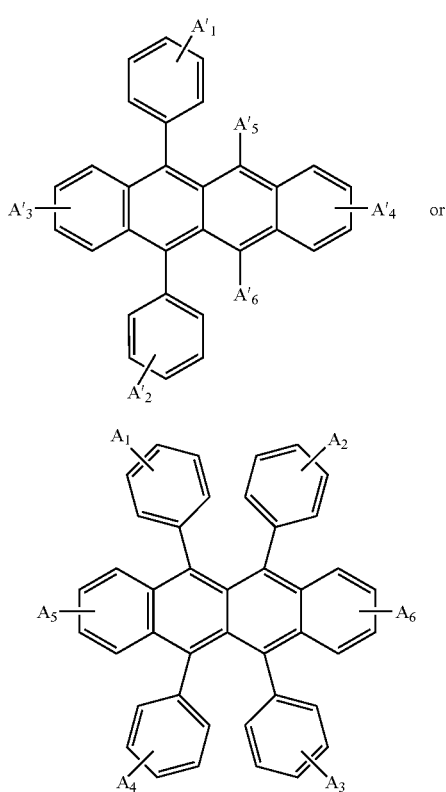

wherein A$_1$-A$_6$ and A'$_1$-A'$_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful yellow dopants of this type are shown by Ricks et al U.S. Pat. No. 7,252,893.

Another class of useful yellow dopants are described in U.S. Pat. No. 6,818,327 and are according to formula J3:

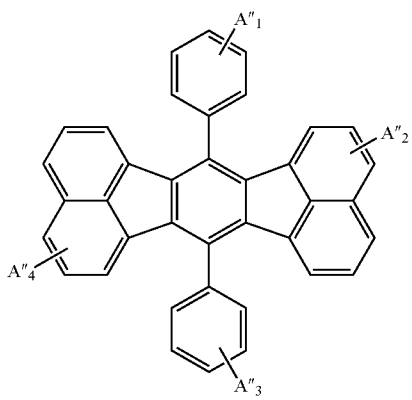

wherein A"$_1$-A"$_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Particularly useful examples are where A"$_1$ and A"$_3$ are hydrogen and A"$_2$ and A"$_4$ are chosen from category 5.

A blue-light-emitting compound such as found in blue light-emitting layer can include a bis(azinyl)azene boron complex compound of the structure K:

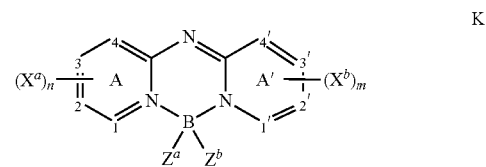

wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide blue luminescence.

Ricks et al. supra disclose some examples of the above class of dopants.

Another class of blue dopants is the perylene class. Particularly useful blue dopants of the perylene class include perylene and tetra-t-butylperylene (TBP).

Another particularly useful class of blue dopants in this invention includes blue-emitting derivatives of such styrylarenes and distyrylarenes as distyrylbenzene, styrylbiphenyl, and distyrylbiphenyl, including compounds described in U.S. Pat. No. 5,121,029. Among such derivatives that provide blue luminescence, particularly useful are those substituted with diarylamino groups. Examples include bis[2-[4-[N,N-diarylamino]phenyl]vinyl]-benzenes of the general structure L1 shown below:

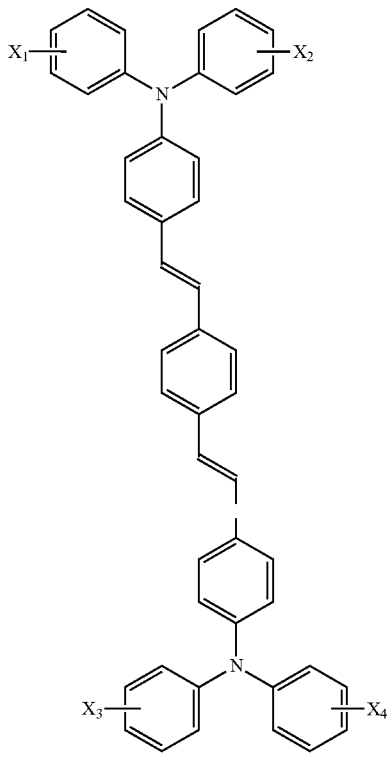

[N,N-diarylamino][2-[4-[N,N-diarylamino]phenyl]vinyl]biphenyls of the general structure L2 shown below:

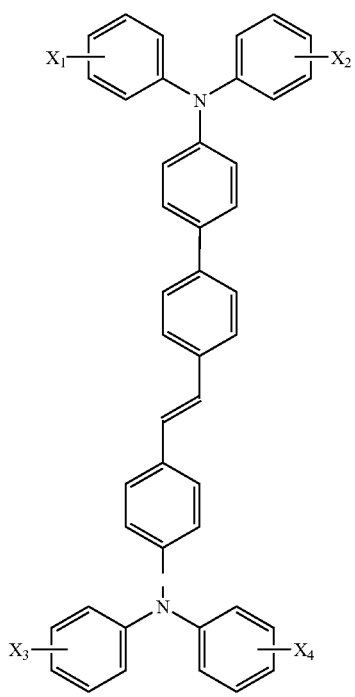

and bis[2-[4-[N,N-diarylamino]phenyl]vinyl]biphenyls of the general structure L3 shown below:

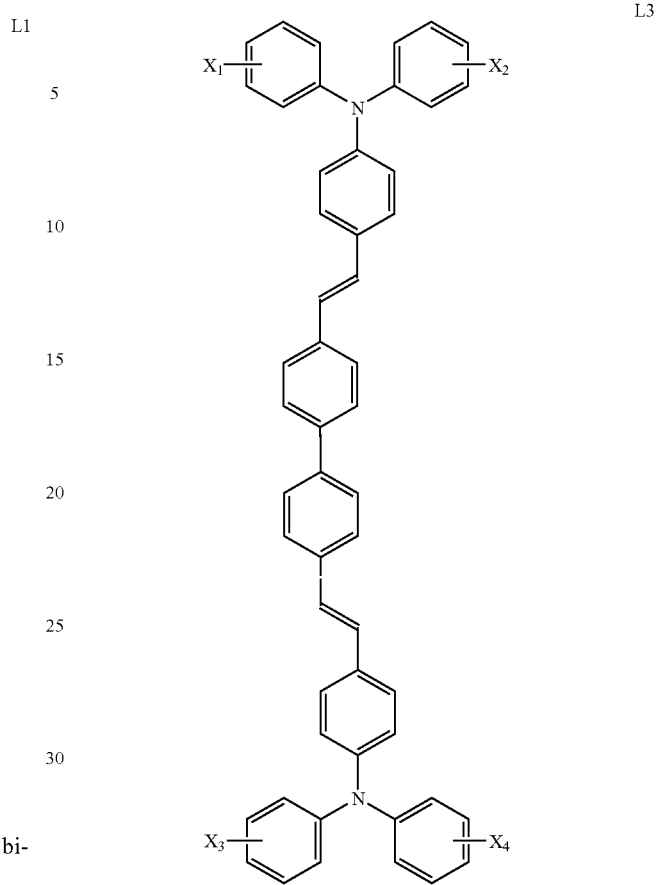

In Formulas L1 to L3, $X_1$-$X_4$ can be the same or different, and individually represent one or more substituents such as alkyl, aryl, fused aryl, halo, or cyano. In a preferred embodiment, $X_1$-$X_4$ are individually alkyl groups, each containing from one to about ten carbon atoms. Ricks et al (cited above) disclose a particularly preferred blue dopant of this class.

Other OLED device layers that can be used in this invention have been well described in the art, and OLED devices 200 and 300, and other such devices described herein, can include layers commonly used for such devices. OLED devices are commonly formed on a substrate, e.g. OLED substrate 210. Such substrates have been well described in the art. A bottom electrode is formed over OLED substrate 210 and is most commonly configured as an anode 220, although the practice of this invention is not limited to this configuration. When EL emission is viewed through the anode, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, are used as the anode. For applications where EL emission is viewed only through the cathode electrode, the transmissive characteristics of the anode are immaterial and any conductive material is used, regardless if it is transparent, opaque, or reflective. Example conductors for the present invention include, but are not limited to, gold, iridium, molybdenum, palladium, and platinum. Typical anode materials, transmissive or otherwise, have a work function no less than 4.0 eV. Any suitable process such as evaporation, sputtering, chemical vapor deposition, or electrochemical process can deposit desired anode materials. Anode materials can be patterned using well-known photolithographic processes.

A hole-injection layer 130 or hole-transporting layer 132 can be formed and disposed over the anode. Any suitable process such as evaporation, sputtering, chemical vapor deposition, electrochemical process, thermal transfer, or laser thermal transfer from a donor material can deposit desired hole-transporting materials. Hole-transporting materials useful in hole-transporting layers include hole-transporting compounds described above as light-emitting hosts.

Electron-transporting layers 238 can contain one or more metal chelated oxinoid compounds, including chelates of oxine itself, also commonly referred to as 8-quinolinol or 8-hydroxyquinoline. Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials.

An upper electrode most commonly configured as a cathode 240 is formed over the electron-transporting layer. If the device is top-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. Evaporation, sputtering, or chemical vapor deposition can deposit cathode materials. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

In OLED devices such as those described herein, one of the electrodes is necessarily transmissive to visible light. The other electrode can be reflective. For example, in FIG. 3, the anodes are transmissive, while the cathode can be reflective. In such a structure, second light-emitting unit 75 is disposed closer to the reflective electrode than first light-emitting unit 25. As described by Boroson et al. in U.S. Patent Application Publication 2007/0001588, it can be particularly useful to place a red-to-green light-emitting unit (e.g. second light-emitting unit 75) in the range of 60-90 nm from a reflecting electrode, and a blue light-emitting unit (e.g. first light-emitting unit 25) in the range of 150-200 nm from the reflecting electrode.

OLED devices 200 and 300 can include other layers as well. For example, a hole-injecting layer 230 or 330 can be formed over the anode, as described in U.S. Pat. No. 4,720,432, U.S. Pat. No. 6,208,075, EP 0 891 121 A1, and EP 1 029 909 A1. An electron-injecting layer, such as alkaline or alkaline earth metals, alkali halide salts, or alkaline or alkaline earth metal-doped organic layers, can also be present between the cathode and the electron-transporting layer.

White OLED devices with yellow and blue light-emitting layers that illustrate the invention were prepared as follows. In the experiments below, color shift/fade measurements were made at the time at which the initial luminance decreased by 50% ($T_{50}$) at 80 mA/cm$^2$. The devices were maintained at room temperature during fading. u' and v' are chromaticity coordinates in the CIE 1976 chromaticity system which is designed for emissive colors. The conversion of CIE 1931 x and y coordinates to CIE 1976 u' and v' coordinates are according to the following formulas: u'=4x/(−2x+12y+3) and v'=9y/(−2x+12y+3). Delta $CIE_x$ is $CIE_x$(initial)−$CIE_x$(aged). Delta $CIE_y$ is $CIE_y$(initial)−$CIE_y$(aged). Delta u'v' is the square root of ((u'(initial)−u'(aged))2+(v'(initial)−v'(aged))2).

EXAMPLES 1.1-1.10

1. A clean glass substrate was deposited by sputtering with indium tin oxide (ITO) to form a transparent electrode of 60 nm thickness.

2. The above-prepared substrate was further treated by vacuum-depositing a 10 nm layer of hexacyanohexaazatriphenylene (CHATP) as a hole-injecting layer (HIL).

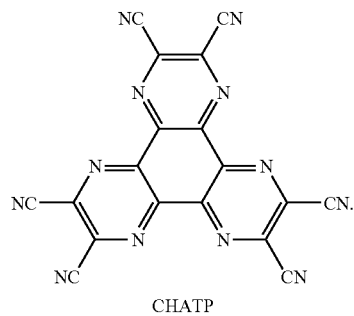

CHATP

3. The above-prepared substrate was further treated by vacuum-depositing a 130 nm layer of 4,4'-bis[N-(1-naphthyl)-N-phenylamino]biphenyl (NPB) as a hole-transporting layer (HTL).

4. The above-prepared substrate was further treated by vacuum-depositing a 20 nm yellow light-emitting layer including 49.5% NPB (as host) and 49.5% 9-(1-naphthyl)-10-(2-naphthyl)anthracene (B11) as a co-host with 1% yellow-orange emitting dopant diphenyltetra-t-butylrubrene (PTBR).

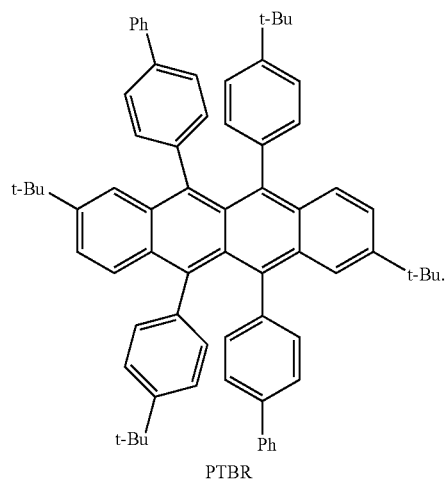 [SMILES: CC(C)(C)c1ccc(-c2c3ccc(C(C)(C)C)cc3c(-c3ccc(-c4ccccc4)cc3)c3c(-c4ccc(C(C)(C)C)cc4)c4ccc(C(C)(C)C)cc4c(-c4ccc(-c5ccccc5)cc4)c23)cc1]

PTBR

5. The above-prepared substrate was further treated by vacuum-depositing a 50 nm blue light-emitting layer (blue LEL1) including 97% B11 host and 3% nm of BED-1 as blue-emitting dopant.

BED-1

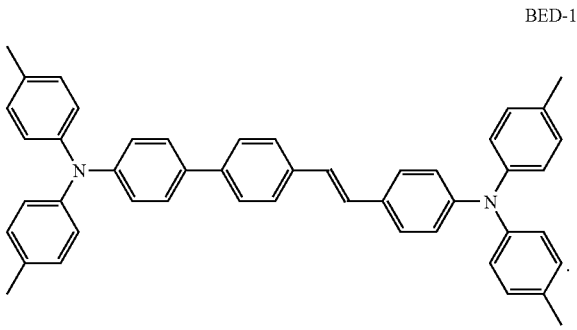 [SMILES: Cc1ccc(N(c2ccc(C)cc2)c2ccc(/C=C/c3ccc(-c4ccc(N(c5ccc(C)cc5)c5ccc(C)cc5)cc4)cc3)cc2)cc1]

6. A 20 nm mixed electron-transporting layer was vacuum-deposited, including 48% 4,7-diphenyl-1,10-phenanthroline (also known as bathophen or Bphen), 48% tris(8-quinolinolato)aluminum (III) (ALQ) as co-host, with 2% L1 metal.

7. A 100 nm layer of aluminum was evaporatively deposited onto the substrate to form a cathode layer.

The above sequence completes the deposition of the EL device. The device was then hermetically packaged in a dry glove box for protection against ambient environment.

Comparative Example 1.2 was prepared as example 1.1 except that the blue LEL1 in step 5 was 40 nm thick and the ETL in step 7 was 30 nm thick.

Comparative example 1.3 was prepared as example 1.2 except that the blue LEL1 in step 5 was composed of 92% B11 host, 7% NPB co-host and 1% BED-2:

BED-2

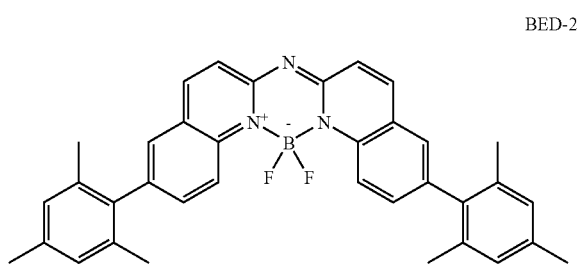

Inventive example 1.4 was prepared as example 1.2 except the blue LEL1 is step 5 was 20 nm thick and a second 20 nm thick blue light-emitting layer (blue LEL2) composed of 92% B11 host, 7% NPB co-host and 1% BED-2 was deposited between blue LEL1 and the ETL of step 6.

Inventive example 1.5 was prepared as example 1.4 except the HTL of step 3 was 140 nm thick.

Inventive sample 1.6 was prepared as example 1.3 except that the second 20 nm thick blue light-emitting layer (blue LEL2) was composed of 85% B11 host, 14% NPB co-host and 1% BED-2.

Inventive sample 1.7 was prepared as example 1.3 except that the blue LEL1 was reduced to 20 nm and a second 20 nm thick blue light-emitting layer (blue LEL2) composed of 97% B11 host and 3% BED-1 deposited between blue LEL1 and the ETL of step 6.

Inventive example 1.8 was prepared as example 1.7 except the HTL of step 3 was 140 nm thick.

Inventive example 1.9 was prepared as example 1.7 except the second 20 nm thick blue light-emitting layer (blue LEL2) was composed of 94% B11 host, 3% NPB co-host and 3% BED-1.

Inventive example 1.10 was prepared as example 1.7 except blue LEL1 was composed of 85% B11, 14% NPB co-host and 1% BED-2.

Comparative example 1.11 was prepared as example 1.1 except the levels of materials in the yellow light emitting layer of step 4 was 33% NPB, 65% B11 and 2% PTBR; and a 10 nm non-emitting buffer layer consisting of 25% and 75% B11 was added between step 4 and the blue LEL1 of step 5, whose thickness was reduced to 30 nm.

The devices thus formed were tested for luminous efficiencies, drive voltages and initial $CIE_{x,y}$ values at an operating current density of 20 mA/cm$^2$ and the results listed in Table 1. Color shifts after aging are reported in Table 2.

TABLE 1

Initial Performance of Devices 1.1-1.10

| Example | Voltage | Efficiency (cd/A) |
| --- | --- | --- |
| 1.1 (Comparative) | 7.1 | 11.0 |
| 1.2 (Comparative) | 6.7 | 10.8 |
| 1.3 (Comparative) | 6.5 | 7.7 |
| 1.4 (Inventive) | 6.1 | 9.7 |
| 1.5 (Inventive) | 5.9 | 9.5 |
| 1.6 (Inventive) | 6.0 | 9.3 |
| 1.7 (Inventive) | 5.4 | 7.9 |
| 1.8 (Inventive) | 5.4 | 8.0 |
| 1.9 (Inventive) | 5.5 | 8.0 |
| 1.10 (Inventive) | 5.0 | 6.3 |
| 1.11 (Comparative) | 5.1 | 8.0 |

TABLE 2

Color Shifts Upon Aging of Devices 1.1-1.10

| Example | Initial $CIE_x$ | Initial $CIE_y$ | Aged $CIE_x$ | Aged $CIE_y$ | Delta $CIE_x$ | Delta $CIE_y$ | Delta u'v' |
| --- | --- | --- | --- | --- | --- | --- | --- |
| 1.1 (Comparative) | 0.284 | 0.289 | 0.314 | 0.315 | 0.030 | 0.026 | 0.023 |
| 1.2 (Comparative) | 0.294 | 0.299 | 0.324 | 0.324 | 0.030 | 0.025 | 0.022 |
| 1.3 (Comparative) | 0.272 | 0.259 | 0.312 | 0.300 | 0.040 | 0.040 | 0.035 |
| 1.4 (Inventive) | 0.279 | 0.286 | 0.309 | 0.312 | 0.030 | 0.026 | 0.024 |
| 1.5 (Inventive) | 0.264 | 0.271 | 0.294 | 0.299 | 0.029 | 0.028 | 0.025 |
| 1.6 (Inventive) | 0.279 | 0.283 | 0.305 | 0.308 | 0.027 | 0.024 | 0.021 |
| 1.7 (Inventive) | 0.272 | 0.259 | 0.297 | 0.287 | 0.025 | 0.028 | 0.023 |
| 1.8 (Inventive) | 0.273 | 0.260 | 0.291 | 0.282 | 0.018 | 0.022 | 0.018 |
| 1.9 (Inventive) | 0.273 | 0.261 | 0.297 | 0.289 | 0.025 | 0.028 | 0.023 |
| 1.10 (Inventive) | 0.218 | 0.214 | 0.246 | 0.244 | 0.028 | 0.030 | 0.031 |
| 1.11 (Comparative) | 0.239 | 0.238 | 0.310 | 0.301 | 0.071 | 0.063 | 0.062 |

In Table 2, examples 1.4-1.6 using BED-1 in the blue layers do not show much improvement in color shift upon aging relative to directly comparative example 1.2. However, these examples show lower voltage. Examples 1.7-1.10 using BED-2 in the blue layers do show an improvement in color shift upon aging relative to directly comparative example 1.3. All inventive examples show improved performance relative to comparative example 1.11 which contains a non-emitting buffer layer between the blue and yellow emitting layers.

EXAMPLES 2.1-2.5

1. A clean glass substrate was deposited by sputtering with indium tin oxide (ITO) to form a transparent electrode of 60 nm thickness.

2. The above-prepared substrate was further treated by vacuum-depositing a 10 nm layer of hexacyanohexaazatriphenylene (CHATP) as a hole-injecting layer (HIL).

3. The above-prepared substrate was further treated by vacuum-depositing a 130 nm layer of 4,4'-bis[N-(1-naphthyl)-N-phenylamino]biphenyl (NPB) as a hole-transporting layer (HTL).

4. The above-prepared substrate was further treated by vacuum-depositing a 20 nm yellow light-emitting layer including 34% NPB (as host) and 64% 9-(1-naphthyl)-10-(2-naphthyl)anthracene (B11) as a co-host with 2% yellow-orange emitting dopant diphenyltetra-t-butylrubrene (PTBR).

5. The above-prepared substrate was further treated by vacuum-depositing a 10 nm non-emitting buffer layer of 25% NPB and 75% B11.

6. The above-prepared substrate was further treated by vacuum-depositing a 30 nm blue light-emitting layer (blue LEL1) including 97% B11 host and 3% nm of BED-1 as blue-emitting dopant.

7. A 40 nm mixed electron-transporting layer was vacuum-deposited, including 48% 4,7-diphenyl-1,10-phenanthroline (also known as bathophen or Bphen), 48% tris(8-quinolinolato)aluminum (III) (ALQ) as co-host, with 2% Li metal.

8. A 100 nm layer of aluminum was evaporatively deposited onto the substrate to form a cathode layer.

The above sequence completes the deposition of the EL device. The device was then hermetically packaged in a dry glove box for protection against ambient environment.

Inventive example 2.2 was prepared as example 2.1 except the buffer layer of step 5 was not present, blue LEL1 of step 6 was 15 nm thick and consisted of 88% B11, 7% NPB and 5% BED-1 and a second 15 nm thick blue light-emitting layer (blue LEL2) composed of 99% B11 host and 1% BED-2 was deposited between blue LEL1 and the ETL of step 7.

Inventive example 2.3 was prepared as example 2.2 except that the blue LEL1 consisted of 85% B11, 10% NPB and 5% BED-1.

Inventive sample 2.4 was prepared as example 2.3 except that the blue LEL2 consisted of 97% B11 host, 3% BED-1 and 1% BED-2.

Inventive sample 2.5 was prepared as example 2.3 except that the blue LEL1 was increased to 20 nm and blue LEL2 was increased to 20 nm.

The devices thus formed were tested for luminous efficiencies, drive voltages and initial $CIE_{x,y}$ values at an operating current density of 20 mA/cm² and the results listed in Table 3. Color shifts after aging are reported in Table 4.

TABLE 3

Initial Performance of Devices 2.1-2.5

| Example | Voltage | Efficiency (cd/A) |
|---|---|---|
| 2.1 (Comparative) | 5.1 | 8.0 |
| 2.2 (Inventive) | 4.6 | 8.2 |
| 2.3 (Inventive) | 4.6 | 7.8 |
| 2.4 (Inventive) | 4.5 | 7.5 |
| 2.5 (Inventive) | 5.0 | 8.2 |

TABLE 4

Color Shifts Upon Aging of Devices 2.1-2.5

| Example | Initial $CIE_x$ | Initial $CIE_y$ | Aged $CIE_x$ | Aged $CIE_y$ | Delta $CIE_x$ | Delta $CIE_y$ | Delta u'v' |
|---|---|---|---|---|---|---|---|
| 2.1 (Comparative) | 0.240 | 0.257 | 0.298 | 0.303 | 0.058 | 0.047 | 0.047 |
| 2.2 (Inventive) | 0.245 | 0.245 | 0.278 | 0.277 | 0.033 | 0.032 | 0.031 |
| 2.3 (Inventive) | 0.240 | 0.237 | 0.278 | 0.274 | 0.038 | 0.037 | 0.036 |
| 2.4 (Inventive) | 0.243 | 0.248 | 0.276 | 0.277 | 0.033 | 0.029 | 0.029 |
| 2.5 (Inventive) | 0.229 | 0.228 | 0.261 | 0.260 | 0.032 | 0.033 | 0.032 |

The results show that the color shift after aging is significantly improved for the inventive devices with two blue layers relative to the comparative example with only one blue layer.

EXAMPLES 3.1-3.3

Tandem OLED devices were prepared by repeating steps 1-7 as described for device 2.1 and then adding the following layers.

8. A 10 nm layer of CHATP was vacuum deposited as a $2^{nd}$ HIL as part of an intermediate connector layer.

9. A 5 nm layer of NPB was vacuum deposited as a $2^{nd}$ HTL as part of an intermediate connector layer.

10. A 16 nm red light emitting layer of 74.75% NPB, 24.75% NPB and 0.5% RD-1 (structure below) was vacuum deposited.

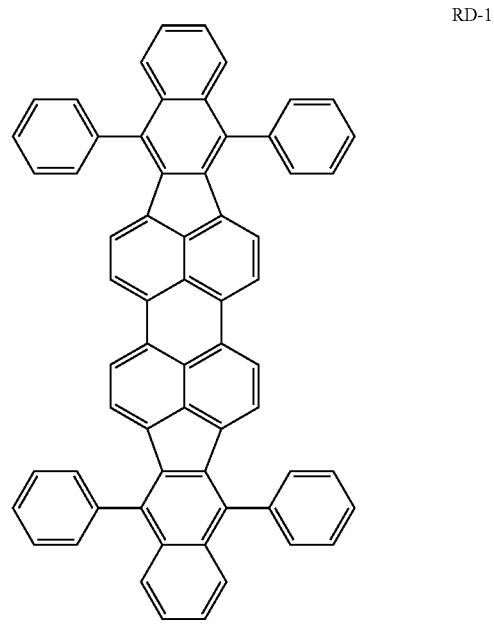 [SMILES: c1ccc(-c2c3c(c(-c4ccccc4)c4ccccc24)-c2ccc4c5ccc6c7c(ccc(c8ccc-3c2c84)c75)-c2c-6c(-c3ccccc3)c3ccccc3c2-c2ccccc2)cc1]

RD-1

11. The above-prepared substrate was further treated by vacuum-depositing a 4 nm yellow light-emitting layer including 24% NPB, 74% B11 and 2% PTBR.

12. Next, a 40 nm green light-emitting layer containing 94% B10 as a host, 5% GED-1 green dopant and 1% BED-2 was vacuum deposited.

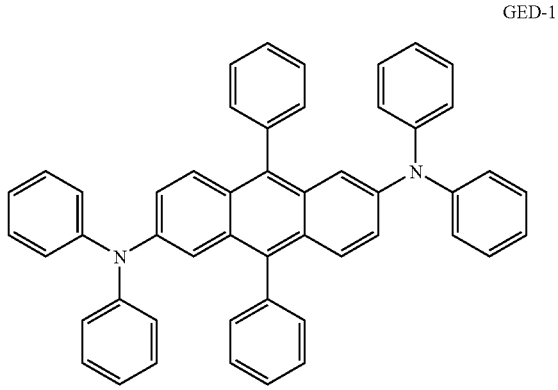 [SMILES: c1ccc(-c2c3ccc(N(c4ccccc4)c4ccccc4)cc3c(-c3ccccc3)c3ccc(N(c4ccccc4)c4ccccc4)cc23)cc1]

GED-1

13. A 40 nm mixed electron-transporting layer was vacuum-deposited, including 48% Bphen, 48% ALQ and 2% Li metal.

14. A 100 nm layer of aluminum was evaporatively deposited onto the substrate to form a cathode layer.

The above sequence completes the deposition of the comparative EL device 3.1. The device was then hermetically packaged in a dry glove box for protection against ambient environment.

Comparative example 3.2 was prepared as example 3.1 except the HTL layer of step 3 was 140 nm thick, the yellow light emitting layer of step 4 was 49% NPB, 49% B11 with 1% PTBR, the buffer layer of step 5 was omitted, and the blue-emitting layer (blue LEL1) of step 6 was 95% B11 host and 5% of BED-1 as blue-emitting dopant.

Inventive example 3.3 was prepared as example 3.2 except that a 20 nm second blue-emitting layer (blue LEL2) of 89% B11, 10% NPB and 1% BED-2 was added between the yellow light-emitting layer of step 4 and the first blue light emitting layer of step 6 (blue LEL1) which was 97% B11 host and 3% of BED-1 and was adjusted to a thickness of 10 nm.

The devices thus formed were tested for luminous efficiencies, drive voltages and initial $CIE_{x,y}$ values at an operating current density of 20 mA/cm$^2$ and the results listed in Table 5. Color shifts after aging are reported in Table 6.

TABLE 5

Initial Performance of Devices 3.1-3.3

| Example | Voltage | Efficiency (cd/A) |
|---|---|---|
| 3.1 (Comparative) | 9.6 | 24.2 |
| 3.2 (Comparative) | 10.1 | 25.0 |
| 3.3 (Inventive) | 9.3 | 21.4 |

TABLE 6

Color Shifts Upon Aging of Devices 3.1-3.3

| Example | Initial $CIE_x$ | Initial $CIE_y$ | Aged $CIE_x$ | Aged $CIE_y$ | Delta $CIE_x$ | Delta $CIE_y$ | Delta u*v* |
|---|---|---|---|---|---|---|---|
| 3.1 (Comparative) | 0.324 | 0.399 | 0.354 | 0.410 | 0.030 | 0.011 | 0.017 |
| 3.2 (Comparative) | 0.316 | 0.394 | 0.339 | 0.402 | 0.022 | 0.008 | 0.013 |
| 3.3 (Inventive) | 0.323 | 0.395 | 0.334 | 0.392 | 0.010 | −0.003 | 0.007 |

The results show that the color shift after aging is significantly improved for the inventive devices with two blue layers relative to the comparative example with only one blue layer.

EXAMPLES 4.1-4.3

Comparative tandem OLED device 4.1 was prepared as example 3.1 except that the level of BED-1 in the blue LEL1 of step 6 was 5% and B11 was 95%.

Inventive OLED device 4.2 was prepared as example 4.1 except that the buffer layer of step 5 was omitted, the blue LEL1 of step 6 was 85% B11, 10% NPB and 5% BED-1 and its thickness was adjusted to 20 nm and a second 20 nm blue light emitting layer (blue LEL2) of 99% B11 and 1% BED-2 was added between blue LEL1 of step 6 and the ETL of step 7.

Inventive OLED device 4.3 was prepared as example 4.2 except both blue LEL1 and blue LEL2 were adjusted to a thickness of 15 nm.

The devices thus formed were tested for luminous efficiencies, drive voltages and initial $CIE_{x,y}$ values at an operating current density of 20 mA/cm$^2$ and the results listed in Table 7. Color shifts after aging are reported in Table 8.

TABLE 7

Initial Performance of Devices 4.1-4.3

| Example | Voltage | Efficiency (cd/A) |
|---|---|---|
| 4.1 (Comparative) | 9.0 | 22.6 |
| 4.2 (Inventive) | 9.1 | 22.5 |
| 4.3 (Inventive) | 8.7 | 20.4 |

TABLE 8

Color Shifts Upon Aging of Devices 4.1-4.3

| Example | Initial $CIE_x$ | Initial $CIE_y$ | Aged $CIE_x$ | Aged $CIE_y$ | Delta $CIE_x$ | Delta $CIE_y$ | Delta u*v* |
|---|---|---|---|---|---|---|---|
| 4.1 (Comparative) | 0.329 | 0.352 | 0.363 | 0.383 | 0.035 | 0.031 | 0.022 |
| 4.2 (Inventive) | 0.320 | 0.350 | 0.344 | 0.373 | 0.024 | 0.022 | 0.016 |
| 4.3 (Inventive) | 0.318 | 0.344 | 0.344 | 0.369 | 0.026 | 0.025 | 0.018 |

The results show that the color shift after aging is significantly improved for the inventive devices with two blue layers relative to the comparative example with only one blue layer.

The invention has been described in detail with particular reference to certain preferred embodiments thereof, but it will be understood that variations and modifications can be effected within the spirit and scope of the invention.

PARTS LIST 25 1$^{st}$ Electroluminescent Unit (ELU)
50 Intermediate Connector
75 2$^{nd}$ Electroluminescent Unit (ELU)
100 OLED Device
110 Substrate
120 Anode
130 Hole Injection Layer (HIL)
132 Hole Transporting Layer (HTL)
134 Yellow Light-emitting Layer (Y LEL)
136 Blue Light-emitting Layer (B LEL1)
138 Electron Transporting Layer (ETL)
140 Cathode
150 Power Source
160 Electrical Connectors
200 OLED Device
210 Substrate
220 Anode
230 Hole Injection Layer (HIL)
232 Hole Transporting Layer (HTL)
234 Yellow Light-emitting Layer (Y LEL)
236 First Blue Light-emitting Layer (B LEL1)
237 Second Blue Light-emitting Layer (B LEL2)
238 Electron Transporting Layer (ETL)
240 Cathode
250 Power Source
260 Electrical Connectors
300 Tandem OPED Device
310 Substrate
320 Anode
330 Hole Injection Layer (HIL) of 1$^{st}$ ELU
332 Hole Transporting Layer (HTL) of 1$^{st}$ ELU 334 Yellow Light-emitting Layer (Y LEL) of 1st ELU
336 First Blue Light-emitting Layer (B LEL1) of 1st ELU
337 Second Blue Light-emitting Layer (B LEL2) of 1st ELU
338 Electron Transporting Layer (ETL) of 1st ELU
340 Connector HIL
345 Connector HTL
350 Red Light Emitting Layer of 2nd EL
355 Yellow Light-emitting Layer of 2nd EL
360 Green Light-emitting Layer of 2nd EL
365 ETL of 2nd EL
370 Cathode
385 Electrical Connectors
390 Power Source

The invention claimed is:

1. An organic white light-emitting device, comprising:
(a) a substrate;
(b) an anode and a cathode spaced from each other;
(c) a yellow light-emitting layer comprising a yellow dopant for emitting yellow light;
   wherein the yellow light-emitting layer further comprises a dinaphthyl anthracene host and an aromatic tertiary amine co-host, and the yellow dopant is a rubrene derivative;
(d) first and second blue light-emitting layers, each blue light-emitting layer having at least one different material than the other blue light-emitting layer; and
wherein the first blue light-emitting layer is in direct contact with the yellow light-emitting layer and the second blue light-emitting layer is adjacent to the first blue light-emitting layer,
wherein the first blue light-emitting layer comprises a dinaphthyl anthracene host, an aromatic tertiary amine co-host up to 12% by volume, and a blue dopant that is a bis(azinyl)azene boron complex compound according to formula K:

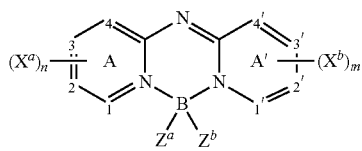

wherein:
A and A' represent independent azine ring systems corresponding to 6-membered aromatic ring systems containing at least one nitrogen;
$(X^a)_n$ and $(X^b)_m$ represent one or more independently selected substituents and include acyclic substituents or are joined to form a ring fused to A or A';
m and n are independently 0 to 4;
$Z^a$ and $Z^b$ are independently selected substituents;
1, 2, 3, 4, 1', 2', 3', and 4' are independently selected as either carbon or nitrogen atoms; and
provided that $X^a$, $X^b$, $Z^a$, and $Z^b$, 1, 2, 3, 4, 1', 2', 3', and 4' are selected to provide blue luminescence; and
wherein the second blue light-emitting layer comprises a dinaphthyl anthracene host, and a blue dopant that is a styrylbiphenyl derivative having a plurality of diarylamino substituents.

2. The organic white light-emitting device of claim 1 wherein the blue light emitted from the first and second blue light-emitting layers have emissive spectrums that are different from each other.

3. The organic white light-emitting device of claim 1 wherein the blue dopant in the second blue light-emitting layer is a
bis[2-[4-[N,N-diarylamino]phenyl]vinyl]biphenyl.

4. A tandem organic white light-emitting device, comprising:
(a) a substrate, an anode and a cathode spaced from each other and two or more light-emitting units disposed between the anode and cathode and an intermediate connector disposed between the two or more light-emitting units; and
(b) at least one of the light-emitting units having:
   (i) a yellow light-emitting layer comprising a yellow dopant for emitting yellow light;
      wherein the yellow light-emitting layer further comprises a dinaphthyl anthracene host and an aromatic tertiary amine co-host, and the yellow dopant is a rubrene derivative;
   (ii) first and second blue light-emitting layers, each blue light-emitting layer having at least one different material than the other blue light-emitting layer; and
   wherein the first blue light-emitting layer is in direct contact with the yellow light-emitting layer and the second blue light-emitting layer is adjacent to the first blue light-emitting layer,
   wherein the first blue light-emitting layer comprises a dinaphthyl anthracene host, an aromatic tertiary amine co-host, and a blue dopant that is a bis(azinyl) azene boron complex compound according to formula K:

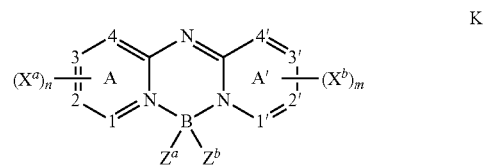

wherein:
A and A' represent independent azine ring systems corresponding to 6-membered aromatic ring systems containing at least one nitrogen;
$(X^a)_n$ and $(X^b)_m$ represent one or more independently selected substituents and include acyclic substituents or are joined to form a ring fused to A or A';
m and n are independently 0 to 4;
$Z^a$ and $Z^b$ are independently selected substituents;
1, 2, 3, 4, 1', 2', 3', and 4' are independently selected as either carbon or nitrogen atoms; and
provided that $X^a$, $X^b$, $Z^a$, and $Z^b$, 1, 2, 3, 4, 1', 2', 3', and 4' are selected to provide blue luminescence; and
wherein the second blue light-emitting layer comprises a dinaphthyl anthracene host, and a blue dopant that is a styrylbiphenyl derivative having a plurality of diarylamino substituents.

5. The organic white light-emitting device of claim 4 wherein the blue light emitted from the first and second blue light-emitting layers have emissive spectrums that are different from each other.

6. The organic white light-emitting device of claim 1 wherein the blue dopant in the second blue light-emitting layer is a [N,N-diarylamino][2-[4-[N,N-diarylamino]phenyl] vinyl]biphenyl.

7. The organic white light-emitting device of claim 1 wherein the second blue light-emitting layer further comprises an aromatic tertiary amine co-host.

8. The organic white light-emitting device of claim 4 wherein the blue dopant in the second blue light-emitting layer is a [N,N-diarylamino][2-[4-[N,N-diarylamino]phenyl]vinyl]biphenyl.

* * * * *